United States Patent
Feng

(10) Patent No.: US 10,290,717 B2
(45) Date of Patent: May 14, 2019

(54) THIN FILM TRANSISTOR, MANUFACTURING METHOD THEREOF, AND DISPLAY DEVICE INCLUDING THE SAME

(71) Applicant: Shenzhen China Star Optoelectronics Technology Co. Ltd., Shenzhen, Guangdong (CN)

(72) Inventor: Tuo Feng, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 361 days.

(21) Appl. No.: 14/892,318

(22) PCT Filed: Oct. 26, 2015

(86) PCT No.: PCT/CN2015/092840
§ 371 (c)(1),
(2) Date: Nov. 19, 2015

(87) PCT Pub. No.: WO2017/063226
PCT Pub. Date: Apr. 20, 2017

(65) Prior Publication Data
US 2017/0194440 A1    Jul. 6, 2017

(51) Int. Cl.
*G02F 1/136* (2006.01)
*G02F 1/1368* (2006.01)
(Continued)

(52) U.S. Cl.
CPC ...... *H01L 29/41733* (2013.01); *G02F 1/1368* (2013.01); *H01L 27/124* (2013.01);
(Continued)

(58) Field of Classification Search
None
See application file for complete search history.

(56) References Cited

U.S. PATENT DOCUMENTS

2007/0087487 A1* 4/2007 Honda ............. H01L 29/41733
438/149

FOREIGN PATENT DOCUMENTS

| CN | 101278403 A | 10/2008 |
| CN | 102064180 A | 5/2011 |

(Continued)

OTHER PUBLICATIONS

Search Report, China Patent Office.

*Primary Examiner* — Raj R Gupta
(74) *Attorney, Agent, or Firm* — Andrew C. Cheng

(57) ABSTRACT

The thin film transistor (TFT) contains a gate electrode metallic layer above a substrate, a gate insulator layer covering the substrate and the gate electrode metallic layer, a first source electrode metallic layer and a first drain electrode metallic layer above the gate insulator layer and separated by a gap, an active layer above the first source and first drain electrode metallic layers filling the gap and forming a ditch in the active layer above the gap, and a second source electrode metallic layer and a second drain electrode metallic layer above the active layer at two lateral sides of the ditch, respectively. The second source/drain electrode metallic layer contacts the first source/drain electrode metallic layer. The TFT has lower parasitic capacitance and takes up less area. As such, when the TFT is applied to a LCD, the reduced space consumed by the TFT enhances pixel's aperture ratio.

2 Claims, 2 Drawing Sheets

(51) Int. Cl.
  *H01L 29/417* (2006.01)
  *H01L 29/786* (2006.01)
  *H01L 27/12* (2006.01)
  *H01L 29/45* (2006.01)

(52) U.S. Cl.
  CPC ........ *H01L 29/41775* (2013.01); *H01L 29/45* (2013.01); *H01L 29/78618* (2013.01); *H01L 29/78669* (2013.01); *G02F 2001/13606* (2013.01); *G02F 2201/40* (2013.01)

(56) References Cited

FOREIGN PATENT DOCUMENTS

| CN | 102522411 A | 6/2012 |
| CN | 104142594 A | 11/2014 |
| CN | 104659106 A | 5/2015 |

\* cited by examiner

THIN FILM TRANSISTOR, MANUFACTURING METHOD THEREOF, AND DISPLAY DEVICE INCLUDING THE SAME

BACKGROUND OF THE INVENTION

1. Field of the Invention

The present invention relates to thin film transistors (TFTs), and in particular to a TFT, its manufacturing method, and a display device employing the TFTs.

2. The Related Arts

Flat panel displays are widely popular in recent years and liquid crystal displays (LCDs) are the mainstream of flat panel displays due to their high space efficiency, low power consumption, no radiation, and low electromagnetic interference.

TFTs are commonly applied to LCDs as switch elements. An important indicator to the quality of TFTs as switch elements is the severity of erroneous write when charging/discharging TFTs, and this is related to the parasitic capacitance $C_{gs}$ between gate and source electrodes. When a TFT is turned on or off, the gate voltage $V_{gs}$ drops instantly from a high level $V_{gon}$ to a low level $V_{goff}$, the variation $\Delta V_{gs}$ of $V_{gs}$ is coupled to the pixel electrode by the parasitic capacitance $C_{gs}$, causing pixel voltage $V_p$ to vary for an amount $\Delta V_p$. $\Delta V_p$ would be bigger as the parasitic capacitance $C_{gs}$ is larger.

SUMMARY OF THE INVENTION

To obviate the shortcoming of the prior art, the present invention provides a thin film transistor (TFT) that contains a substrate, a gate electrode metallic layer above the substrate, a gate insulator layer covering the substrate and the gate electrode metallic layer, a first source electrode metallic layer and a first drain electrode metallic layer, both above the gate insulator layer and separated by a gap, an active layer above the first source and first drain electrode metallic layers filling the gap and forming a ditch in the active layer above the gap, and a second source electrode metallic layer and a second drain electrode metallic layer, both above the active layer and at two lateral sides of the ditch, respectively. The second source electrode metallic layer contacts the first source electrode metallic layer, and the second drain electrode metallic layer contacts the first drain electrode metallic layer.

In one embodiment, the gap reveals a portion of the gate insulator layer. A remaining portion of the gate insulator layer is completely covered by the first source and first drain electrode metallic layers.

The active layer covers a portion of the first source electrode metallic layer and a portion of the first drain electrode metallic layer. The second source electrode metallic layer covers a remaining portion of the first source electrode metallic layer not covered by the active layer. The second drain electrode metallic layer covers a remaining portion of the first drain electrode metallic layer not covered by the active layer.

When the TFT is connected with a pixel electrode, a passivation layer is configured above the second source and second drain electrode metallic layers. The passivation layer fills the ditch and covers the second source and second drain electrode metallic layers. A via is configured in the passivation layer revealing the second drain electrode metallic layer. The pixel electrode is above the passivation layer and contacts the second drain electrode metallic layer through the via.

In another embodiment, the gap reveals a portion of the gate insulator layer. A remaining portion of the gate insulator layer is partially covered by the first source and first drain electrode metallic layers.

The active layer covers a portion of the first source electrode metallic layer and a portion of the first drain electrode metallic layer. The second source electrode metallic layer covers a portion of the first source electrode metallic layer not covered by the active layer and a portion of the gate insulator layer not covered by the first source electrode metallic layer. The second drain electrode metallic layer covers a portion of the first drain electrode metallic layer not covered by the active layer and a portion of the gate insulator layer not covered by the first drain electrode metallic layer.

When the TFT is connected with a pixel electrode, a passivation layer is configured above the second source and second drain electrode metallic layers. The passivation layer fills the ditch and covers the second source and second drain electrode metallic layers. A via is configured in the passivation layer revealing the second drain electrode metallic layer. The pixel electrode is above the passivation layer and contacts the second drain electrode metallic layer through the via.

In yet another embodiment, the gap reveals a portion of the gate insulator layer. A remaining portion of the gate insulator layer is completely covered by the first source and first drain electrode metallic layers. The active layer covers a portion of the first source electrode metallic layer and a portion of the first drain electrode metallic layer. The second source electrode metallic layer covers a portion of the first source electrode metallic layer not covered by the active layer. The second drain electrode metallic layer covers a portion of the first drain electrode metallic layer not covered by the active layer.

When the TFT is connected with a pixel electrode, a passivation layer is configured above the second source and second drain electrode metallic layers. The passivation layer fills the ditch and covers the second source electrode metallic layer and a remaining portion of the first source electrode metallic layer not covered by the second source electrode metallic layer. The passivation layer also covers the second drain electrode metallic layer and a remaining portion of the first drain electrode metallic layer not covered by the second drain electrode metallic layer. A via is configured in the passivation layer revealing the first drain electrode metallic layer. The pixel electrode is above the passivation layer and contacts the first drain electrode metallic layer through the via.

Another objective of the present invention is to provide a TFT manufacturing method which contains the following steps. Firstly, a gate electrode metallic layer is formed above a substrate. Then, a gate insulator layer is formed covering the substrate and the gate electrode metallic layer. Then, a first source electrode metallic layer and a first drain electrode metallic layer are formed, both above the gate insulator layer and separated by a gap. Then, an active layer is formed above the first source and first drain electrode metallic layers where the active layer fills the gap and a ditch is formed in the active layer above the gap. Finally, a second source electrode metallic layer and a second drain electrode metallic layer are formed, both above the active layer and at two lateral sides of the ditch, respectively, where the second source electrode metallic layer contacts the first source electrode metallic layer, and the second drain electrode metallic layer contacts the first drain electrode metallic layer.

Yet another objective of the present invention is to provide a liquid crystal display device that contains the above TFTs, or TFTs manufactured by the above method.

According to the present invention, source and drain metallic layers are formed both above and below the active layer, thereby effectively lowering the parasitic capacitance $C_{gs}$ between the source and drain metallic layers, and reducing the area taken up by the TFT. As such, when the TFT is applied to a LCD device, the reduced space consumed by the TFT enhances pixel's aperture ratio.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Please note that, in the accompanied drawings, layer thickness is exaggerated for clarity's sake, and same reference numbers are always applied to same elements.

It should be understood that terms "first," "second," etc. are used to refer to elements only for naming purpose, and these elements are not limited by these terms.

It should also be understood that, when a layer or an element is said to be or to be formed "above" another layer or a substrate, it can be directly on or directly formed on the latter, or some intermediate layer is present in between.

First Embodiment

Figure 1:
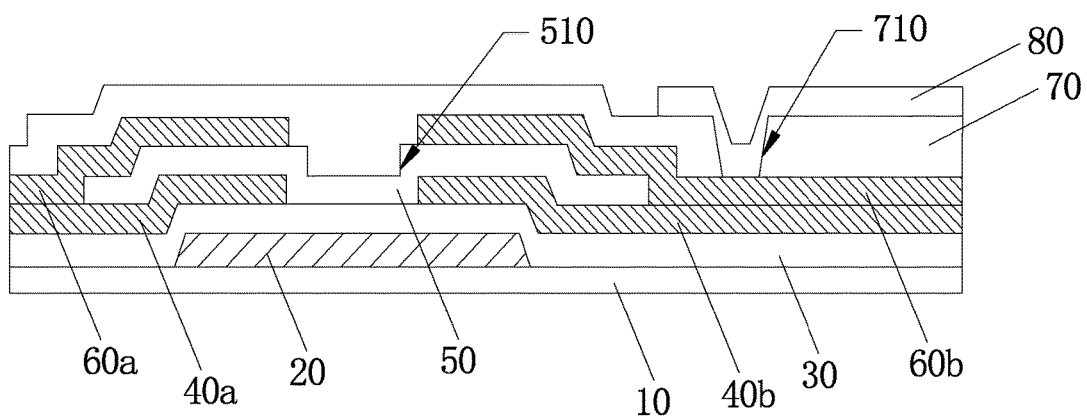
FIG. 1 is a schematic diagram showing a thin film transistor (TFT) according to a first embodiment of the present invention.

FIG. 1 is a schematic diagram showing a thin film transistor (TFT) according to a first embodiment of the present invention.

As illustrated, a substrate 10 is provided. In the present embodiment, the substrate 10 is a transparent glass substrate. The present invention however is not limited as such. For example, the substrate 10 can also be a transparent resin substrate.

Then, a gate electrode metallic layer 20 is formed above the substrate 10. In the present embodiment, the gate electrode metallic layer 20 has a Mo/Al dual-layer structure. However, the present invention is not limited as such. For example, the gate electrode metallic layer 20 can also have a Ta single-layer structure, a Mo/Ta dual-layer structure, a Mo/W dual-layer structure, or an Al single-layer structure.

Then, a gate insulator layer 30 is formed to cover the substrate 10 and the gate electrode metallic layer 20. In the present embodiment, the gate insulator layer 30 is made of silicon nitride and/or silicon oxide but the present invention is not limited as such.

Then, a first photoetching mask is applied to form separated first source electrode metallic layer 40a and first drain electrode metallic layer 40b, both above the gate insulator layer 30 where a portion of the gate insulator layer 30 is exposed from a gap between the first source and first drain electrode metallic layers 40a and 40b, and the rest of the gate insulator layer 30 is completely covered by the first source and first drain electrode metallic layers 40a and 40b. In the present embodiment, both the first source and first drain electrode metallic layers 40a and 40b have a Mo/Al/Mo three-layer structure, but the present invention is not limited as such. For example, the first source electrode metallic layers 40a and/or the first drain electrode metallic layers 40b can have a Ta single-layer structure, a Mo/Ta dual-layer structure, a Mo/W dual-layer structure, or an Al single-layer structure.

Then, an active layer 50 is formed above the first source and first drain electrode metallic layers 40a and 40b where the active layer 50 fills the gap between the first source and first drain electrode metallic layers 40a and 40b, and covers a portion of the first source electrode metallic layer 40a, and a portion of the first drain electrode metallic layer 40b. Additionally, a ditch 510 is formed in the active layer 50 above the gap between the first source and first drain electrode metallic layers 40a and 40b. In the present embodiment, the active layer 50 is made of amorphous silicon but the present invention is not limited as such.

Finally, the first photoetching mask is applied to form a second source electrode metallic layer 60a and a second drain electrode metallic layer 60b above the first source electrode metallic layer 40a and the first drain electrode metallic layer 40b, respectively, where the second source electrode metallic layer 60a covers the remaining portion of the first source electrode metallic layer 40a not covered by the active layer 50, and the second drain electrode metallic layer 60b covers the remaining portion of the first drain electrode metallic layer 40b not covered by the active layer 50. In the present embodiment, the second source and second drain electrode metallic layers 60a and 60b has a Mo/Al/Mo three-layer structure, but the present invention is not limited as such. For example, the second source electrode metallic layers 60a and/or the second drain electrode metallic layers 60b can have a Ta single-layer structure, a Mo/Ta dual-layer structure, a Mo/W dual-layer structure, or an Al single-layer structure.

The above is the manufacturing process of the TFT according to the first embodiment of the present invention. When the TFT according to the first embodiment of the present invention is applied as a switch element in a LCD device, the gate electrode metallic layer 20 is formed together with and is connected to a gate line (not shown). Similarly, the first or second source electrode metallic layer 40a or 60a is formed together with a data line (not shown) and the first and second source electrode metallic layers 40a and 60a are both connected to the data line. Then, a passivation layer 70 is formed to cover the second source and second drain electrode metallic layers 60a and 60b, and to fill the ditch 510. Then a via 710 revealing the second drain electrode metallic layer 60b is formed in the passivation layer 70. Then, a pixel electrode 80 is formed on the passivation layer 70 and the pixel electrode 80 contacts the second drain electrode metallic layer 60b through the via 710. In the present embodiment, the pixel electrode 80 is made of indium tin oxide (ITO) but the present invention is not limited as such.

Second Embodiment

Figure 2:
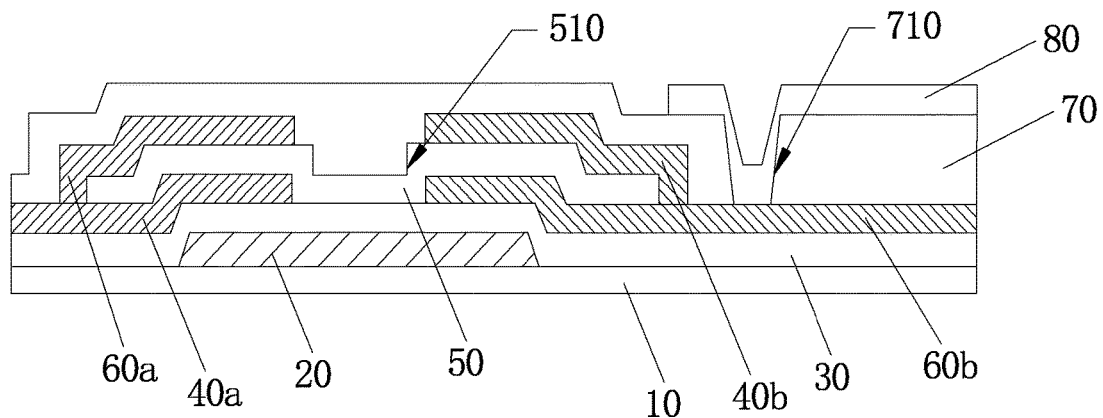
FIG. 2 is a schematic diagram showing a TFT according to a second embodiment of the present invention.

FIG. 2 is a schematic diagram showing a TFT according to a second embodiment of the present invention.

As illustrated, a substrate 10 is provided. In the present embodiment, the substrate 10 is a transparent glass substrate. The present invention however is not limited as such. For example, the substrate 10 can also be a transparent resin substrate.

Then, a gate electrode metallic layer 20 is formed above the substrate 10. In the present embodiment, the gate electrode metallic layer 20 has a Mo/Al dual-layer structure. However, the present invention is not limited as such. For example, the gate electrode metallic layer 20 can also have a Ta single-layer structure, a Mo/Ta dual-layer structure, a Mo/W dual-layer structure, or an Al single-layer structure.

Then, a gate insulator layer 30 is formed to cover the substrate 10 and the gate electrode metallic layer 20. In the present embodiment, the gate insulator layer 30 is made of silicon nitride and/or silicon oxide but the present invention is not limited as such.

Then, a first photoetching mask is applied to form separated first source electrode metallic layer 40a and first drain electrode metallic layer 40b, both above the gate insulator layer 30 where a portion of the gate insulator layer 30 is exposed from a gap between the first source and first drain electrode metallic layers 40a and 40b, and the rest of the gate insulator layer 30 is completely covered by the first source and first drain electrode metallic layers 40a and 40b. In the present embodiment, both the first source and first drain electrode metallic layers 40a and 40b have a Mo/Al/Mo three-layer structure, but the present invention is not limited as such. For example, the first source electrode metallic layers 40a and/or the first drain electrode metallic layers 40b can have a Ta single-layer structure, a Mo/Ta dual-layer structure, a Mo/W dual-layer structure, or an Al single-layer structure.

Then, an active layer 50 is formed above the first source and first drain electrode metallic layers 40a and 40b where the active layer 50 fills the gap between the first source and first drain electrode metallic layers 40a and 40b, and covers a portion of the first source electrode metallic layer 40a, and a portion of the first drain electrode metallic layer 40b. Additionally, a ditch 510 is formed in the active layer 50 above the gap between the first source and first drain electrode metallic layers 40a and 40b. In the present embodiment, the active layer 50 is made of amorphous silicon but the present invention is not limited as such.

Then, a second photoetching mask is applied to form a second source electrode metallic layer 60a and a second drain electrode metallic layer 60b above the first source electrode metallic layer 40a and the first drain electrode metallic layer 40b, respectively, where the second source electrode metallic layer 60a covers a portion of the first source electrode metallic layer 40a not covered by the active layer 50, and the second drain electrode metallic layer 60b covers a portion of the first drain electrode metallic layer 40b not covered by the active layer 50. In the present embodiment, the second source and second drain electrode metallic layers 60a and 60b has a Mo/Al/Mo three-layer structure, but the present invention is not limited as such. For example, the second source electrode metallic layers 60a and/or the second drain electrode metallic layers 60b can have a Ta single-layer structure, a Mo/Ta dual-layer structure, a Mo/W dual-layer structure, or an Al single-layer structure.

The above is the manufacturing process of the TFT according to the second embodiment of the present invention. When the TFT according to the second embodiment of the present invention is applied as a switch element in a LCD device, the gate electrode metallic layer 20 is formed together with and is connected to a gate line (not shown). Similarly, the first or second source electrode metallic layer 40a or 60a is formed together with a data line (not shown) and the first and second source electrode metallic layers 40a and 60a are both connected to the data line. Then, a passivation layer 70 is formed to cover the first source and first drain electrode metallic layers 40a and 40b and the second source and second drain electrode metallic layers 60a and 60b, and to fill the ditch 510. Then a via 710 revealing the first drain electrode metallic layer 40b is formed in the passivation layer 70. Then, a pixel electrode 80 is formed on the passivation layer 70 and the pixel electrode 80 contacts the first drain electrode metallic layer 40b through the via 710. In the present embodiment, the pixel electrode 80 is made of indium tin oxide (ITO) but the present invention is not limited as such.

Third Embodiment

Figure 3:
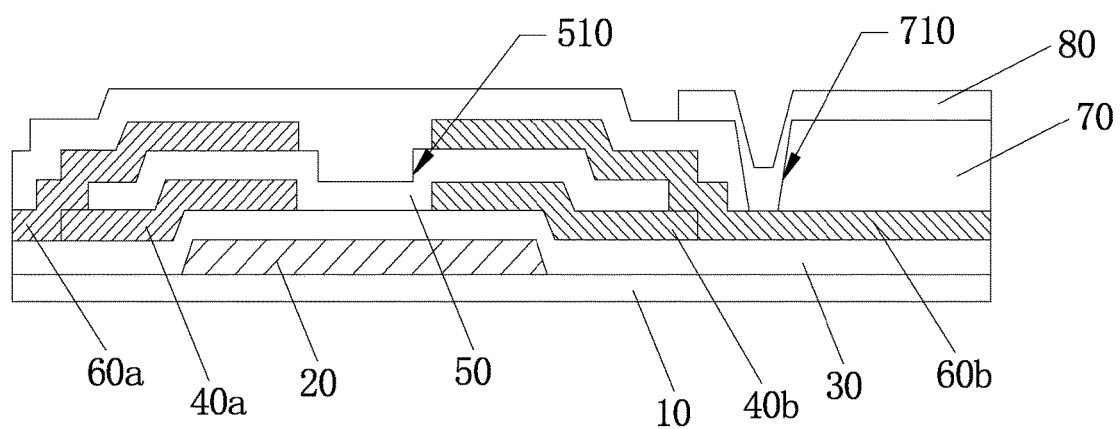
FIG. 3 is a schematic diagram showing a TFT according to a third embodiment of the present invention.

FIG. 3 is a schematic diagram showing a TFT according to a third embodiment of the present invention.

As illustrated, a substrate 10 is provided. In the present embodiment, the substrate 10 is a transparent glass substrate. The present invention however is not limited as such. For example, the substrate 10 can also be a transparent resin substrate.

Then, a gate electrode metallic layer 20 is formed above the substrate 10. In the present embodiment, the gate electrode metallic layer 20 has a Mo/Al dual-layer structure. However, the present invention is not limited as such. For example, the gate electrode metallic layer 20 can also have a Ta single-layer structure, a Mo/Ta dual-layer structure, a Mo/W dual-layer structure, or an Al single-layer structure.

Then, a gate insulator layer 30 is formed to cover the substrate 10 and the gate electrode metallic layer 20. In the present embodiment, the gate insulator layer 30 is made of silicon nitride and/or silicon oxide but the present invention is not limited as such.

Then, the second photoetching mask is applied to form separated first source electrode metallic layer 40a and first drain electrode metallic layer 40b, both above the gate insulator layer 30 where a portion of the gate insulator layer 30 is exposed from a gap between the first source and first drain electrode metallic layers 40a and 40b, and the rest of the gate insulator layer 30 is completely covered by the first source and first drain electrode metallic layers 40a and 40b. In the present embodiment, both the first source and first drain electrode metallic layers 40a and 40b have a Mo/Al/Mo three-layer structure, but the present invention is not limited as such. For example, the first source electrode metallic layers 40a and/or the first drain electrode metallic layers 40b can have a Ta single-layer structure, a Mo/Ta dual-layer structure, a Mo/W dual-layer structure, or an Al single-layer structure.

Then, an active layer 50 is formed above the first source and first drain electrode metallic layers 40a and 40b where the active layer 50 fills the gap between the first source and first drain electrode metallic layers 40a and 40b, and covers a portion of the first source electrode metallic layer 40a, and a portion of the first drain electrode metallic layer 40b.

Additionally, a ditch 510 is formed in the active layer 50 above the gap between the first source and first drain electrode metallic layers 40a and 40b. In the present embodiment, the active layer 50 is made of amorphous silicon but the present invention is not limited as such.

Then, the first photoetching mask is applied to form a second source electrode metallic layer 60a and a second drain electrode metallic layer 60b above the first source electrode metallic layer 40a and the first drain electrode metallic layer 40b, respectively, where the second source electrode metallic layer 60a covers the portion of the first source electrode metallic layer 40a not covered by the active layer 50 and the portion of the gate insulator layer 30 not covered by the first source electrode metallic layer 40a, and the second drain electrode metallic layer 60b covers the portion of the first drain electrode metallic layer 40b not covered by the active layer 50 and the portion of the gate insulator layer 30 not covered by the first drain electrode metallic layer 40b. In the present embodiment, the second source and second drain electrode metallic layers 60a and 60b has a Mo/Al/Mo three-layer structure, but the present invention is not limited as such. For example, the second source electrode metallic layers 60a and/or the second drain electrode metallic layers 60b can have a Ta single-layer structure, a Mo/Ta dual-layer structure, a Mo/W dual-layer structure, or an Al single-layer structure.

The above is the manufacturing process of the TFT according to the second embodiment of the present invention. When the TFT according to the second embodiment of the present invention is applied as a switch element in a LCD device, the gate electrode metallic layer 20 is formed together with and is connected to a gate line (not shown). Similarly, the first or second source electrode metallic layer 40a or 60a is formed together with a data line (not shown) and the first and second source electrode metallic layers 40a and 60a are both connected to the data line. Then, a passivation layer 70 is formed to cover the second source and second drain electrode metallic layers 60a and 60b, and to fill the ditch 510. Then a via 710 revealing the second drain electrode metallic layer 60b is formed in the passivation layer 70. Then, a pixel electrode 80 is formed on the passivation layer 70 and the pixel electrode 80 contacts the second drain electrode metallic layer 60b through the via 710. In the present embodiment, the pixel electrode 80 is made of indium tin oxide (ITO) but the present invention is not limited as such.

As described above, according to the present invention, source and drain metallic layers are formed both above and below the active layer, thereby effectively lowering the parasitic capacitance $C_{gs}$ between the source and drain metallic layers, and reducing the area taken up by the TFT. As such, when TFT is applied to a LCD device, the reduced space consumed by the TFT enhances pixel's aperture ratio.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A thin film transistor (TFT), comprising:
   a substrate;
   a gate electrode metallic layer above the substrate;
   a gate insulator layer covering the substrate and the gate electrode metallic layer;
   a first source electrode metallic layer and a first drain electrode metallic layer, above and respectively covering a portion of the gate insulator layer and separated by a first gap where the first gap is over the gate electrode metallic layer and reveals a portion of the gate insulator layer;
   an active layer above the first source and first drain electrode metallic layers where the active layer fills the first gap and covers a portion of the first source electrode metallic layer and a portion of the first drain electrode metallic layer, and a ditch is configured in the active layer over the first gap;
   a second source electrode metallic layer and a second drain electrode metallic layer, respectively covering and physically contacting a portion of the gate insulator layer outside the first source and first drain electrode metallic layers, a portion of the first source and first drain electrode metallic layers outside the active layer, and a portion of the active layer outside the ditch, where the second source and second electrode metallic layers are separated by a second gap, and the second gap is over the ditch;
   a passivation layer filling the second gap and the ditch, and covering the second source and drain electrode metallic layers; and
   a via running through the passivation layer reaching the second drain electrode metallic layer.

2. The TFT as claimed in claim 1, further comprising a pixel electrode, wherein the pixel electrode is above the passivation layer, fills the via, and contacts the second drain electrode metallic layer.

* * * * *